United States Patent [19]
Jolly

[11] 3,930,908
[45] Jan. 6, 1976

[54] ACCURATE CONTROL DURING VAPOR PHASE EPITAXY

[75] Inventor: Stuart Talbot Jolly, Yardley, Pa.
[73] Assignee: RCA Corporation, New York, N.Y.
[22] Filed: Sept. 30, 1974
[21] Appl. No.: 510,462

[52] U.S. Cl. ............... 148/175; 118/48; 118/49.5; 148/174; 156/610; 156/613
[51] Int. Cl.² .................. H01L 21/20; H01L 21/205
[58] Field of Search ........... 148/174, 175; 156/610, 156/613; 118/48, 49.5

[56] References Cited
UNITED STATES PATENTS

| | | | |
|---|---|---|---|
| 3,173,814 | 3/1965 | Law | 148/175 |
| 3,243,323 | 3/1966 | Corrigan et al. | 148/175 |
| 3,321,278 | 5/1967 | Theuerer | 148/175 UX |
| 3,366,516 | 1/1968 | McAleer et al. | 148/174 |
| 3,413,145 | 11/1968 | Robinson et al. | 148/175 X |
| 3,511,702 | 5/1970 | Jackson et al. | 148/174 X |
| 3,522,118 | 7/1970 | Taylor et al. | 148/175 X |
| 3,721,583 | 3/1973 | Blakeslee | 148/175 X |

OTHER PUBLICATIONS

Blakeslee, A. E., "Vapor Growth of a Semiconductor Superlattice", J. Electrochem. Soc., Solid State Science, Vol. 118, No. 9, Sept. 1971, pp. 1459–1463.

*Primary Examiner*—L. Dewayne Rutledge
*Assistant Examiner*—W. G. Saba
*Attorney, Agent, or Firm*—Glenn H. Bruestle; Carl L. Silverman

[57] ABSTRACT

A small quantity or low flow rate of a gaseous component is accurately and quickly introduced into the reaction chamber during the process of vapor phase epitaxy. The gaseous component is selectively communicated directly into a primary gaseous flow which passes into the reaction chamber. By maintaining a continuous flow of the gaseous component, the gaseous component can be accurately introduced into the reaction chamber without initially entering the reaction chamber with a large surge of concentration.

8 Claims, 7 Drawing Figures

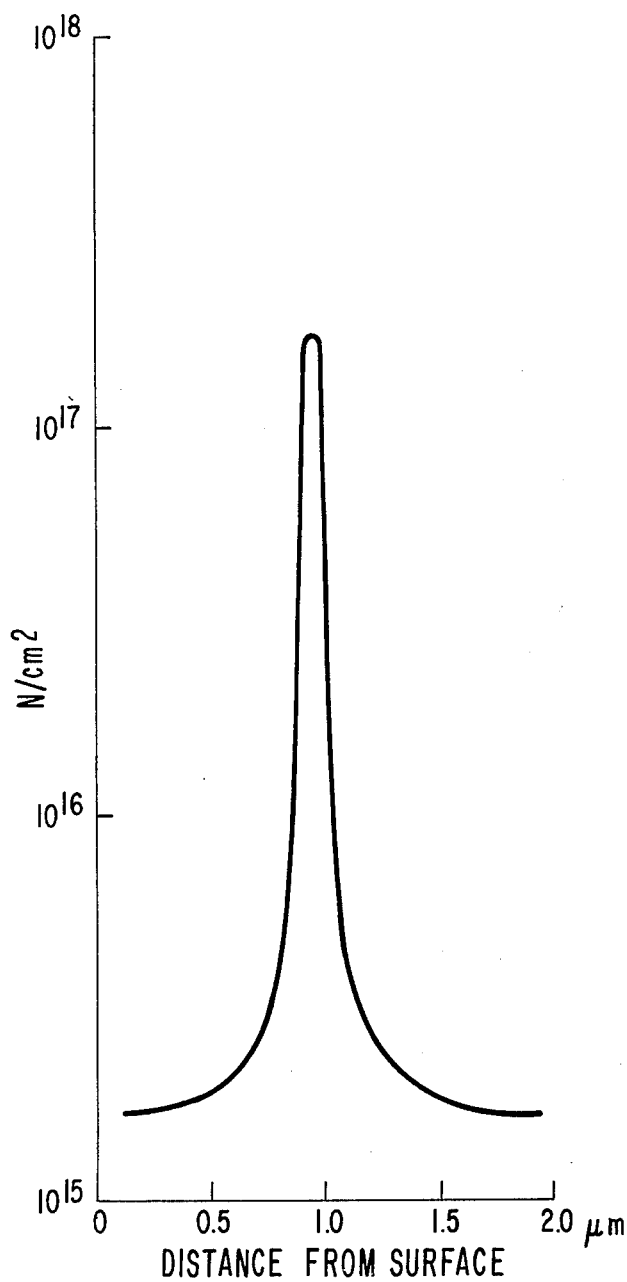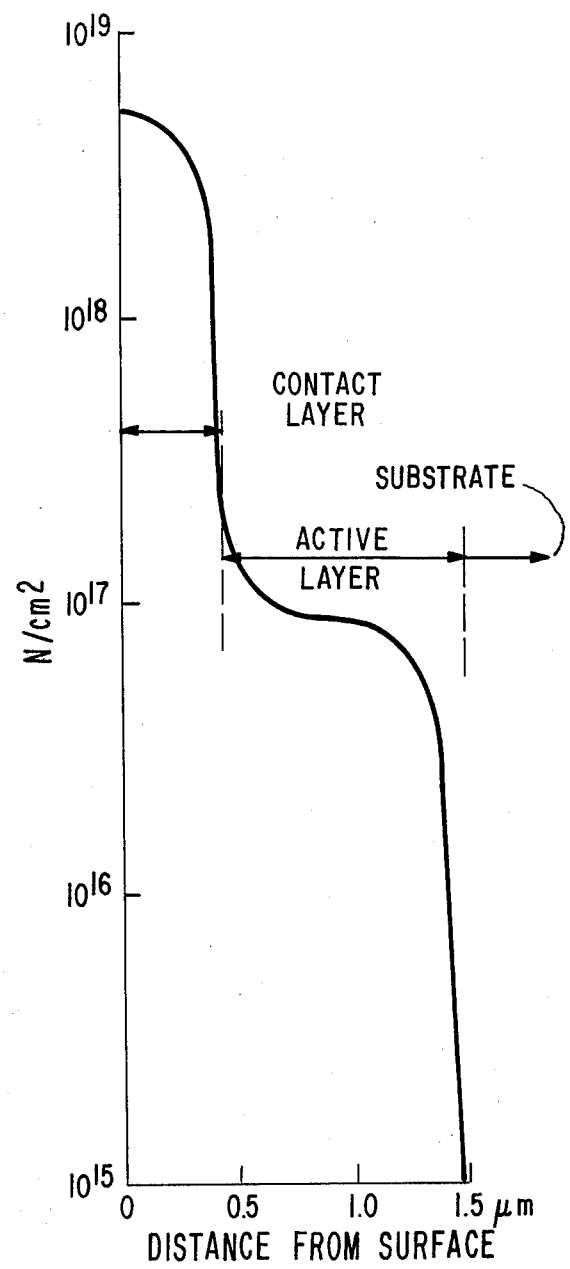
Fig_4.   Fig_5.

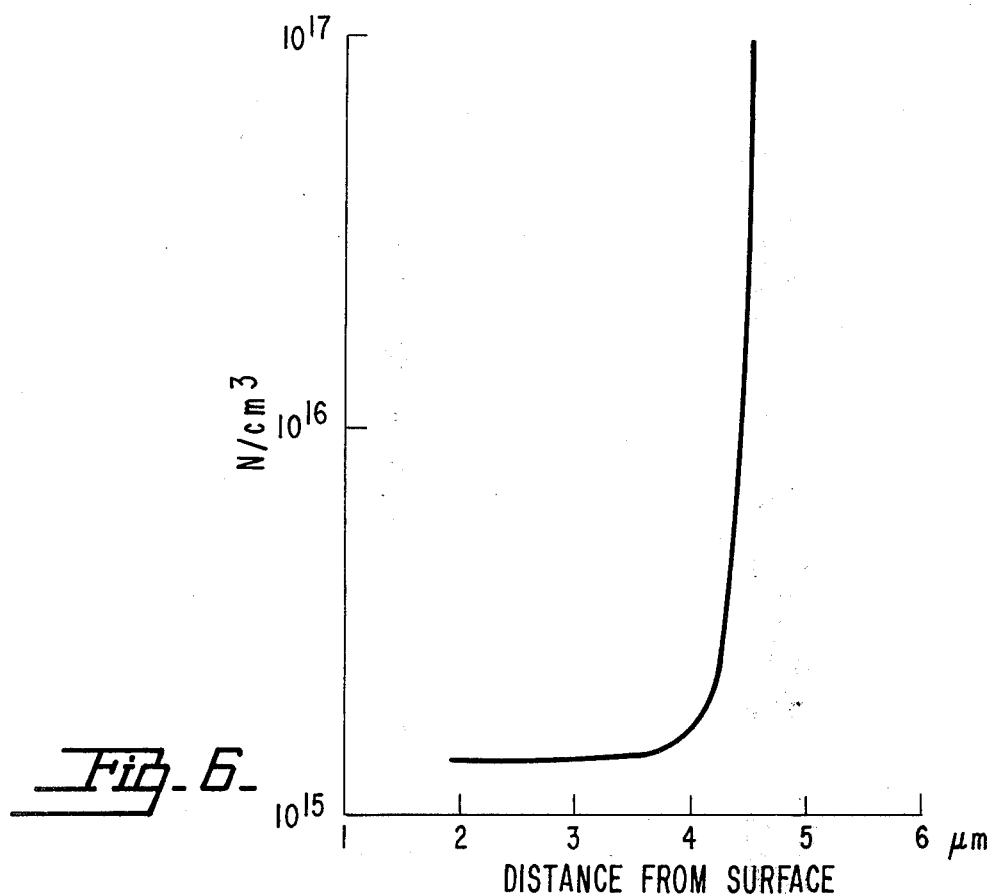
_Fig.-6-_
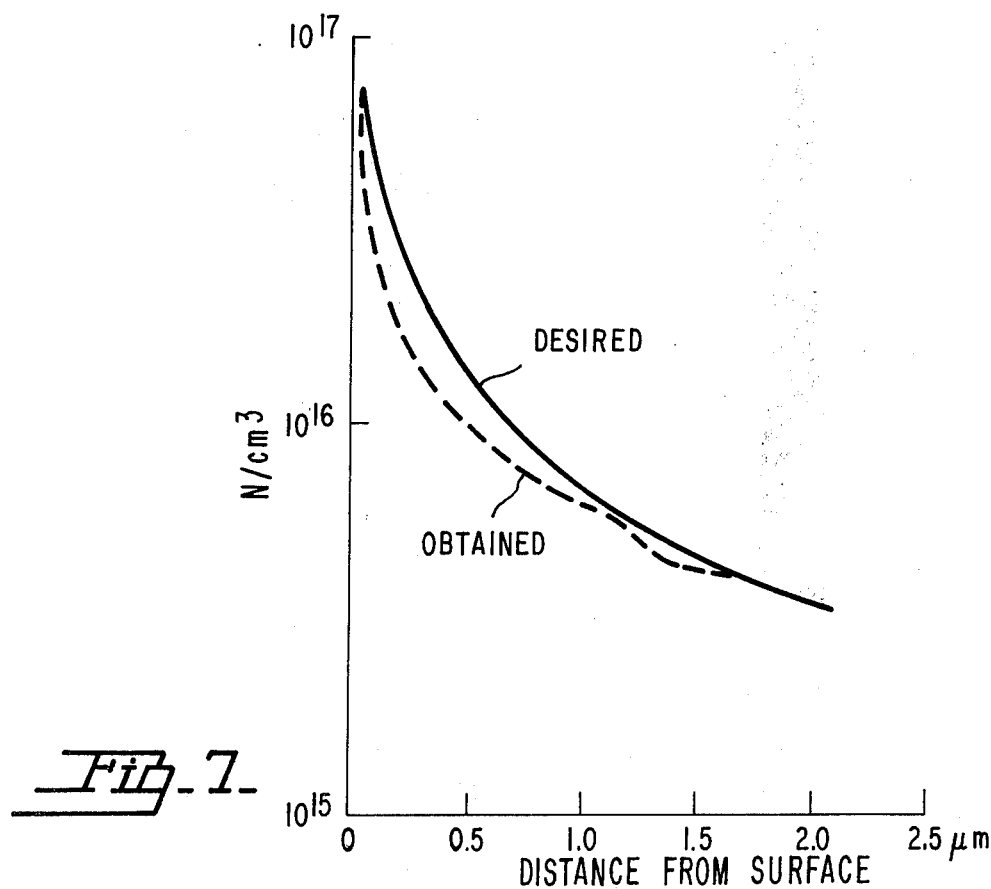
_Fig.-7-_

3,930,908

ACCURATE CONTROL DURING VAPOR PHASE EPITAXY

BACKGROUND OF THE INVENTION

The invention herein described was made in the course of or under a contract or subcontract thereunder with the Department of the Army.

The present invention relates to vapor phase epitaxy, and particularly, to a method of accurately and quickly varying the rate of flow of a gaseous component into a reaction chamber.

Vapor phase epitaxy is a well-known process for forming layers of semiconductor material on a substrate. Generally, the process directs gaseous reactants into a reaction chamber for deposition of the desired material onto a substrate. The operating temperature and pressure of the process is specific to the individual materials being combined, or deposited, and is well known in the art.

Often, it is desirable to add an additional impurity in the form of a gaseous reactant, such as a conductivity modifier, into the reaction chamber in order to form a layer of the semiconductor material in which the conductivity modifier is present. It is often necessary to quickly and accurately vary the rate of flow of at least one gaseous component into the reaction chamber in order to form semiconductor layers which sharply differ in concentration of that one component, or for other purposes, such as controlling the growth rate. For example, it is often desirable to form a sharp change in carrier type or carrier concentration through the process of vapor phase epitaxy. In order to form the desired layers as quickly as possible, it is necessary to minimize the time it takes to introduce particular gaseous components into the reaction chamber. Present methods attempt to minimize this introducing time by placing the source of gaseous components as near as possible to the reaction chamber. In addition, present methods often slow down the overall growth rate in order to compensate for the delay caused by the introduction of a small quantity or low flow rate of a gaseous component into the reaction chamber. A more drastic technique often employed involves stopping the overall growth rate and then adding a particular gaseous component into the chamber, or equally drastic, moving the substrate into another deposition chamber.

Although present methods are often adequate for steady state conditions, these methods are less than desirable when it is necessary to sharply and accurately introduce or regulate at least one gaseous component into the reaction chamber. Present methods are especially undesirable where it is necessary to accurately and quickly introduce or regulate a small quantity or low flow rate of gaseous component into the reaction chamber while other gaseous materials are forming the semiconductor layers in the reaction chamber, e.g., for forming very thin multilayer gallium arsenide structures for field effect transistors, Impatt diodes and other devices.

Present methods are unable to quickly and accurately vary the rate of flow of a small quantity of a gaseous component into the reaction chamber since the gaseous component will initially enter the reaction chamber in a large surge of concentration followed by a lower concentration. Furthermore, the small quantity or low flow rate of the gaseous component will also be delayed by the time necessary to travel from the controlling device to the reaction chamber. It would therefore be desirable to develop a method for accurately and quickly varying the rate of flow of a gaseous component into the reaction chamber.

SUMMARY OF THE INVENTION

A method for quickly and accurately varying the rate of flow of a gaseous component into the reaction chamber during the process of vapor phase epitaxy. A primary gaseous flow is established into the reaction chamber. A desired flow of the gaseous component is established. The gaseous component is communicated directly into the primary gaseous flow such that the gaseous component is swept into the reaction chamber whenever the gaseous component is communicated directly into the primary gaseous flow.

BRIEF DESCRIPTION OF THE DRAWINGS

FIG. 4 is a carrier concentration profile of epitaxial layers of semiconductor material having a sharp peak in concentration formed through the method of the present invention.

FIG. 5 is a carrier concentration profile of epitaxial layers of semiconductor material having a sharply defined high and low region of carrier concentration formed through the method of the present invention.

FIG. 6 is a carrier concentration profile showing a layer of low carrier concentration semiconductor material on a layer of high carrier concentration semiconductor material formed through the method of the present invention.

FIG. 7 is a carrier concentration profile showing a semiconductor material having a predetermined varying carrier concentration formed through the method of the present invention.

DETAILED DESCRIPTION OF THE INVENTION

The method of the present invention is useful for quickly and accurately varying the rate of flow of a gaseous component into the reaction chamber during the process of vapor phase epitaxy. The method includes the establishing of a primary gaseous flow into the reaction chamber, and the establishing of a desired flow of the gaseous component. The gaseous component is communicated directly into the primary gaseous flow to be swept into the reaction chamber whenever the gaseous component is required to be introduced into the reaction chamber. When the gaseous component is not desired in the reaction chamber, the gaseous component is communicated away from the primary gaseous flow. If desired, the flow of gaseous component can also be varied as it is communicated into the primary gaseous flow.

Figure 1:
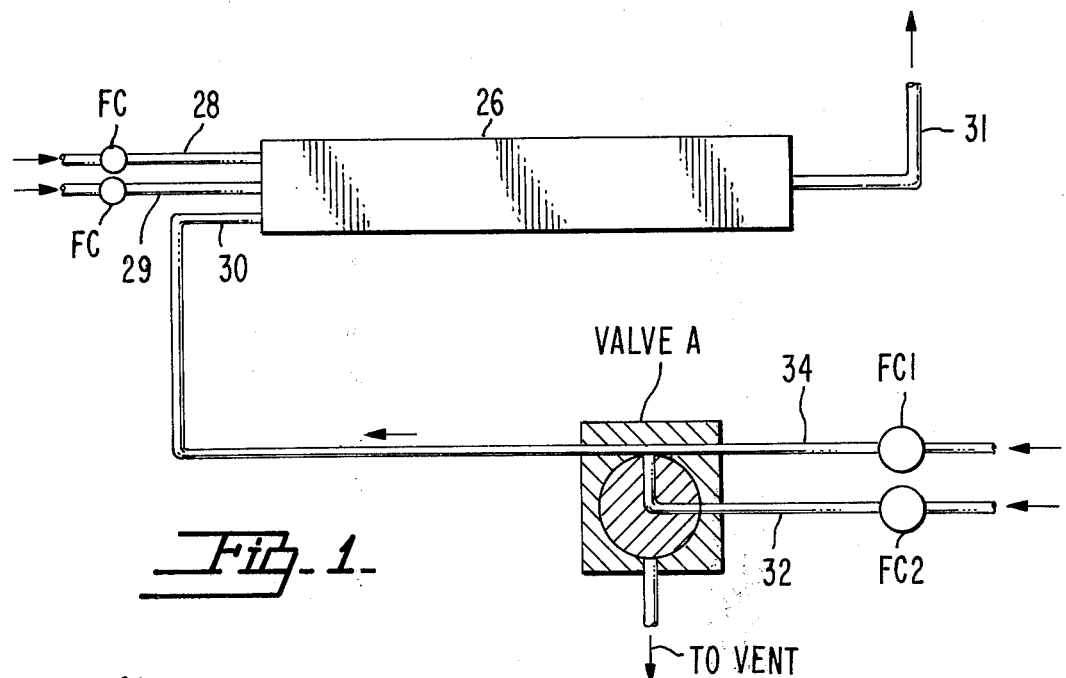
FIG. 1 is a schematic view of a portion of an apparatus useful in the method of the present invention.

A schematic view of a portion of an apparatus useful in the method of the present invention is shown in FIG. 1. The apparatus includes a reaction chamber 26 having inlets 28, 29 and 30 for the reaction gases. The inlets 28, 29, and 30 are connected to sources of gaseous material (not shown) with standard flow control (FC) valves disposed between the source of gaseous material and the reaction chamber 26. The apparatus includes a vent 31 as is well known in the art. The apparatus shown in FIG. 1 also includes the valve A as well as the standard flow control (FC) valves. The apparatus includes a tube network for communicating gas flows which includes the tubes 32 and 34. The flow control (FC) valves are capable of regulating a flow of gas therethrough and are well known and available in the art. The valve A should be capable of communicating a primary gaseous flow therethrough. In addition, the valve A should also be capable of communicating a flow of gaseous component directly into or away from the primary gaseous flow such that the gaseous component is swept into the reaction chamber 26 whenever the gaseous component is communicated directly into the primary gaseous flow.

Figure 2:
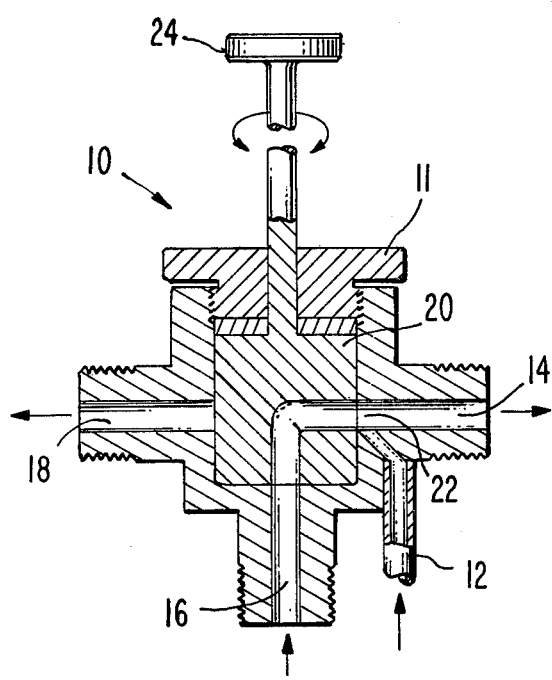
FIG. 2 is a cross-sectional view of one form of a control valve useful in the method of the present invention.

Referring to FIG. 2, one form of a control valve useful for performing the function of the valve A of FIG. 1 in the method of the present invention is generally designated as 10. The control valve 10 includes a valve housing 11. The valve housing 11 includes an inlet 12 which can communicate a primary gaseous flow into and through the valve housing 11 and then out through an outlet 14. The valve housing 11 also includes an inlet 16 which can communicate a flow of gaseous material into and through the valve housing 11 and out either through the outlet 14 or out through a vent 18. The valve housing 11 includes a directing means 20 which can be rotated so that a flow of gaseous material entering into the inlet 16 exits either through the outlet 14 (as shown) or through the vent 18. The inlets 12 and 16 are disposed in such a manner that an area 22 in the valve housing 11 forms a common passage so that a primary flow of gaseous material established into the inlet 12 and then out the outlet 14 will sweep a weaker gaseous flow established into the inlet 16 so as to be swept out through the outlet 14. In addition, the area 22 also functions to mix the gaseous materials which pass therethrough. The valve housing 11 also includes a control means 24 for rotating the directing means 20 into the desired position. The control valve 10 can be easily constructed by drilling an additional inlet (12) into a conventional three way valve.

To carry out the method of the present invention with the apparatus shown, a primary gaseous flow is directed through the system via the tube 34. The primary gaseous flow is controlled by a standard flow control valve (FC1). The primary gaseous flow then passes through the valve A and into the reaction chamber 26. At the valve A, the primary gaseous flow sweeps along any gaseous component which has been communicated to the valve A. For example, as shown, a standard flow control valve (FC2) can be utilized to determine the flow of a gaseous component through the tube 32 which is to be communicated to the valve A and which is desired to be introduced into the reaction chamber 26. It is desirable that the flow of the gaseous component communicated through the tube 32 and into the valve A is kept continuously flowing, i.e., the flow of gaseous component is either directed into the primary gaseous flow which passes through the valve A or vented away from the primary gaseous flow.

The gaseous component is therefore quickly and accurately introduced into the reaction chamber without an initial large surge of concentration as in the prior art. Thus, the gaseous component communicated to the valve A is swept into the reaction chamber whenever the gaseous component is communicated directly into the primary gaseous flow at the valve A.

In the method of the present invention, it is preferable to maximize the velocity of the primary gaseous flow so as to minimize the time necessary for sweeping the gaseous component into the reaction chamber so that the overall growth rate on the substrate can be maintained, i.e., without slowing or stopping the overall growth rate so as to introduce the gaseous component. As in the prior art, it is always desirable to locate the valve, such as valve A, as near as possible to the reaction chamber so as to minimize the response time. In addition, it is often desirable to maintain a relation wherein the flow of the gaseous component into the reaction chamber is varied without appreciably altering the flow of other gaseous material into the reaction chamber, e.g., the flow of gaseous component introduced into the chamber is small as compared to the flow of primary gaseous flow.

The method of the present invention thus includes introducing a primary gaseous flow into and through a valve in order to sweep a gaseous component, which is also directed into the valve, quickly and accurately into the reaction chamber during the process of vapor phase epitaxy. Specifically, in the process of gallium arsenide vapor phase epitaxy, it is convenient to be able to introduce concentrations of gaseous components consisting of only 1/10,000 of the total gas flow into the system. This means that the flow rate of the gaseous component required may be of the order of 0.1 cc./min. The gaseous component must appear in the reaction chamber in a very short time, e.g., a few seconds. Typically, the primary gaseous flow is one of the reaction gases, or an inert material, such as hydrogen, and the gaseous component is hydrogen sulfide.

Although the valve A, as previously described, is useful in carrying out the method of the present invention, it may be preferable to use another type of valve for some applications. For example, although the valve A is very successful in quickly and accurately introducing a gaseous component into the reaction chamber in accordance with the method of the present invention, it is difficult to utilize the valve A in a situation where a predetermined varying carrier concentration profile is desired. Therefore, it is important to utilize another structure, e.g., a valve B, which can perform the functions of the valve A and which, in addition, is capable of varying the flow of the gaseous component which is communicated directly into a primary gaseous flow to be thereafter swept into the reaction chamber.

Figure 3:
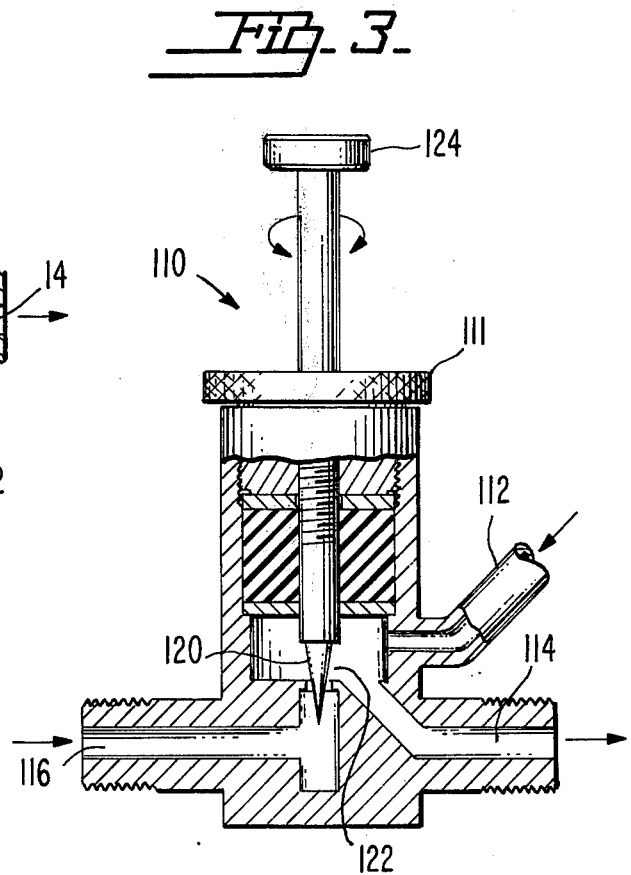
FIG. 3 is a cross-sectional view of another form of a control valve useful in the method of the present invention.

A specific embodiment of a structure for the valve B is shown in FIG. 3 in which the valve B, also termed a regulating valve, is generally designated as 110. The regulating valve 110 includes a valve housing 111. The valve housing 111 includes an inlet 112 which can communicate a primary gaseous flow into and through the valve housing 111 and then out through an outlet 114. The valve housing 111 also includes an inlet 116 which can communicate a flow of gaseous material into and through the valve housing 111 and out through the outlet 114. Disposed between the inlet 116 and the outlet 114 is a needle control means 120 for controlling the flow of gaseous material which can pass directly into a primary flow of gaseous material established into the inlet 112 and out of the outlet 114. The valve housing 111 also includes a control means 124 for positioning the needle control means 120 such that a desired flow of gaseous material is allowed to pass therethrough. The area 122 in the valve housing 111 forms a common passage as in the valve 10 of FIG. 2. Preferably, the area 122 has a volume such that the time necessary to sweep out any gaseous material from the area 122 is minimized, i.e., the area 122 has a minimal volume. The regulator valve 110 of FIG. 3 can be constructed by appropriately modifying a conventional flow control valve.

Thus, a valve B, such as the regulator valve 110 of FIG. 3 can be utilized in the method of the present invention whenever a varying predetermined carrier concentration is desired. In such cases, the valve B functions to quickly and accurately introduce a regulated flow of a gaseous component directly into the primary gaseous flow. The primary gaseous flow then sweeps the gaseous component into the reaction chamber.

Specifically, the primary gaseous flow in the tube 34 can be hydrogen, e.g., about 1,200 cc./min with about 10 cc./min of HCl (tube 28) and 150 cc./min of 7% $AsH_3$ in hydrogen (tube 29) also being introduced, as in FIG. 1. About 800 cc./min hydrogen (tube 28) can be utilized to sweep the HCl along. The method of the present invention permits the quick and accurate introduction of a gaseous component (tube 32) which, for example, can be 20 ppm or 500 ppm of $H_2S$ in hydrogen at 0–50 cc./min. If desired, two or more valves such as valve A can be utilized such that more than one gaseous component can be quickly and accurately introduced into the reaction chamber 26, e.g., a separate valve, similar to valve A, can be utilized for the $H_2S$ at both the 20 ppm or 500 ppm concentration of $H_2S$.

The use of the method of the present invention therefore permits the quick and accurate introduction of a gaseous component into the reaction chamber during the process of vapor phase epitaxy. Some of the advantages and applications of the method of the present invention are illustrated in examples 1–4.

EXAMPLE 1

One application of the method of the present invention is to form semiconductor layers on a conducting substrate in which the carrier concentration in the semiconductor layers varies sharply as in FIG. 4. As can be seen in FIG. 4, the carrier concentration varies sharply from about $1.7 \times 10^{15}$ N/cm$^3$ to about $1.7 \times 10^{17}$ N/cm$^3$ over a thickness of about .7 microns, where N represents the number of carriers which may be electrons or holes in a particular situation. The sharp carrier concentration variation was achieved through the use of the method of the present invention wherein the gaseous component, e.g., $H_2S$, is quickly introduced and then directed away during the epitaxial growth of gallium arsenide on a substrate. Thus, the method of the present invention allows the sharp peak of FIG. 5 to be formed without employing the time consuming task of slowing the overall growth rate of the wafer or stopping the growth completely. The sharp variations of FIG. 4 are useful in obtaining high regions for LO-HI-LO Impatt diodes.

Specifically, a flow rate of 0.1 cc./min of 20 ppm $H_2S$ in hydrogen was established through a valve substantially the same as valve B. The 0.1 cc./min of 20 ppm $H_2S$ was communicated directly into a primary gaseous flow of an inert material, such as hydrogen, which was established into the reaction chamber such that the 20 ppm $H_2S$ was quickly and accurately swept into the reaction chamber. Then, when the sharp peak was desired, the flow rate of the 20 ppm $H_2S$ through the valve was increased to 13 cc./min and then decreased to 0.1 cc./min and communicated directly into the primary gaseous flow to be quickly and accurately swept into the reaction chamber.

EXAMPLE 2

The carrier concentration profile of FIG. 5 also illustrates the sharp difference in carrier concentrations in semiconductors layers achieved through the method of the present invention wherein the carrier concentration varies sharply from about $8 \times 10^{16}$ N/cm$^3$ of the active layer to about $5 \times 10^{18}$ N/cm$^3$ of the contact layer over a thickness of about 0.5 microns. The method of the present invention is utilized to quickly and accurately introduce the gaseous component into the reaction chamber while the layers are being formed. The variations shown in FIG. 5 are useful in obtaining material for field effect transistors.

Specifically, two valves such as valve A were utilized in the epitaxial growth of gallium arsenide. A flow rate of 4 cc./min of 20 ppm $H_2S$ in hydrogen was established through one valve and a flow rate of 20 cc./min of 500 ppm $H_2S$ in hydrogen was established through the second valve. Both of the flows were vented away from the reaction chamber until required so as to prevent surges of concentration. The 4 cc./min of 20 ppm $H_2S$ was then communicated directly into a primary gaseous flow, such as hydrogen, to be quickly and accurately swept into the reaction chamber so as to form the active layer. Then, the 20 cc./min of 500 ppm $H_2S$ was communicated directly into the primary gaseous flow, such as hydrogen, to be quickly and accurately swept into the reaction chamber so as to form the contact layer. The 4 cc./ min of 20 ppm $H_2S$ was not vented away during the introduction of the 20 cc./min of 500 ppm since the 4 cc./min of $H_2S$ was of low enough concentration in relation to the 20 cc./min of 500 ppm $H_2S$ so as to be of little concern for the purpose shown in FIG. 5.

EXAMPLE 3

The method of the present invention also permits the formation of a layer of low carrier concentration semiconductor material directly on a layer of high carrier concentration semiconductor material as shown in FIG. 6 without being hampered by an interface uncertainty which often confronted the prior art. The interface uncertainty would often lead to situations where the high carrier concentration did not change to a low carrier concentration smoothly, as in FIG. 6. The method of the present invention allows one to quickly introduce the gaseous component for the high carrier concentration buffer layer and then quickly direct the gaseous component away. Also, the method allows one to quickly and accurately introduce the gaseous component for the low concentration layer. Thus, the method of the present invention permits the low carrier concentration layer to be formed as part of a continuous process after the formation of the buffer layer whereas the prior art would require a different deposition zone or evacuation and flushing of the reaction chamber.

Specifically, two valves such as valve A were utilized in the epitaxial growth of gallium arsenide. A flow rate of 1.5 cc./min of 500 ppm $H_2S$ in hydrogen was established through one valve to be used for the high carrier concentration buffer layer. A flow rate of 0.15 cc./min of 20 ppm $H_2S$ in hydrogen was established through the second valve to be used for the low carrier concentration layer. Both flows were vented away until required in the reaction chamber as in Example 2. The 1.5 cc./min of 500 ppm $H_2S$ was then communicated directly into the primary gaseous flow, such as hydrogen, to be quickly and accurately swept into the reaction chamber so as to form the buffer layer. Then, immediately following the formation of the buffer layer, the flow of 1.5 cc./min 500 ppm $H_2S$ was vented away and the flow of 0.15 cc./min 20 ppm $H_2S$ was communicated directly into another primary gaseous flow, such as hydrogen, to be quickly and accurately swept into the reaction chamber so as to form the low-carrier concentration layer.

EXAMPLE 4

The capability of accurate control of epitaxial growth and carrier concentration is shown in FIG. 7 in which a predetermined varying carrier concentration profile is achieved without interfering with the overall growth rate. The carrier concentration profile of FIG. 7 would be useful in obtaining material for fabrication of hyperabrupt varactor diodes. In this application of the method of the present invention, a valve such as valve B is utilized in order to communicate a predetermined varying flow rate of a gaseous component, e.g., $H_2S$, directly into a primary gaseous flow, such as hydrogen, to be quickly and accurately swept into the reaction chamber during the epitaxial growth of gallium arsenide.

Although the method of the present invention has been illustrated showing the formation of gallium arsenide epitaxial growths, it is apparent that the method of the present invention is equally successful for any kind of epitaxial growth in the vapor phase. Furthermore, although the method has been described with the use of the valve 10 of FIG. 2 and the valve 110 of FIG. 3, the method will be successful as long as any valve capable of performing as previously described is utilized. Also, although the method of the present invention has been illustrated with a primary gaseous flow sweeping only one gaseous component into the reaction chamber, the method also includes having one primary gaseous flow sweeping several gaseous components as well as having several primary gaseous flows which function similarly. Thus, there is provided by the method of the present invention, a method for accurately and quickly controlling the rate of flow of a gaseous component into the reaction chamber during the process of vapor phase epitaxy.

I claim:

1. In the process of vapor phase epitaxy, a method for quickly and accurately varying the rate of flow of a gaseous component into the reaction chamber, comprising the steps of:
   a. establishing at least one primary gaseous flow into said reaction chamber,
   b. establishing a desired flow of said gaseous component, and
   c. communicating with gaseous component directly into said primary gaseous flow with said gaseous component passing through substantially no intervening space before reaching said primary gaseous flow such that said gaseous component is swept into said reaction chamber whenever said gaseous component is communicated directly into said primary gaseous flow.

2. A method in accordance with claim 1 in which said gaseous component is communicated away from the primary gaseous flow when said gaseous component is not required in said reaction chamber.

3. A method in accordance with claim 2 in which said flow of gaseous component is kept continuously flowing.

4. A method in accordance with claim 3 in which said flow of gaseous component introduced into said primary gaseous flow is small as compared to the flow of said primary gaseous flow introduced into reaction chamber.

5. A method in accordance with claim 4 in which said flow of gaseous component introduced into said reaction chamber is varied without appreciably altering said primary gaseous flow.

6. In the process of vapor phase epitaxy in which more than one gaseous component is communicated into a reaction chamber for deposition onto a substrate, a method for quickly and accurately varying the rate of flow of at least one of said gaseous components into said reaction chamber, comprising the steps of:
   a. establishing at least one primary gaseous flow into said reaction chamber,
   b. establishing a desired flow of said one gaseous component, and
   c. communicating with one gaseous component directly into said primary gaseous flow with said gaseous component passing through substantially no intervening space before reaching said primary gaseous flow such that said one gaseous component is swept into said reaction chamber whenever said one gaseous component is communicated directly into said primary gaseous flow.

7. A method in accordance with claim 6 in which said primary gaseous flow has a maximized velocity such that the overall growth rate on said substrate is maintained.

8. In the process of vapor phase epitaxy in which more than one gaseous component is communicated into a reaction chamber for deposition onto a substrate, a method for quickly and accurately varying the rate of flow of at least one of said gaseous components into said reaction chamber, comprising the steps of:
   a. establishing at least one primary gaseous flow through a control member and into said reaction chamber,
   b. establishing a desired flow of said one gaseous component through said control member, and
   c. communicating said one gaseous component directly into said primary gaseous flow in said control member with said gaseous component passing through substantially no intervening space before reaching said primary gaseous flow such that one gaseous component is swept into said reaction chamber whenever said one gaseous component is communicated directly into said primary gaseous flow.

* * * * *